(12) United States Patent
Müller et al.

(10) Patent No.: US 6,888,145 B2
(45) Date of Patent: May 3, 2005

(54) OPTICAL PARTICLE CORRECTOR

(75) Inventors: Heiko Müller, Heidelberg (DE); Harald Rose, Darmstadt (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 0 days.

(21) Appl. No.: 10/478,820

(22) PCT Filed: Dec. 3, 2002

(86) PCT No.: PCT/DE02/04431
§ 371 (c)(1),
(2), (4) Date: Nov. 21, 2003

(87) PCT Pub. No.: WO03/049140
PCT Pub. Date: Jun. 12, 2003

(65) Prior Publication Data
US 2004/0155200 A1 Aug. 12, 2004

(30) Foreign Application Priority Data
Dec. 4, 2001 (DE) .......................... 101 59 308

(51) Int. Cl.[7] .............................................. H01J 37/153
(52) U.S. Cl. ............................. 250/396 ML; 250/305; 250/311
(58) Field of Search .................. 250/305, 311, 250/396 ML

(56) References Cited

U.S. PATENT DOCUMENTS

| | | | | |
|---|---|---|---|---|
| 2,919,381 | A | * 12/1959 | Glaser ......................... | 315/382 |
| 3,952,198 | A | * 4/1976 | Harada et al. ....... | 250/396 ML |
| 2002/0084422 | A1 | * 7/2002 | Kienzle et al. ...... | 250/396 ML |
| 2003/0098415 | A1 | * 5/2003 | Matsuya et al. ............ | 250/306 |

FOREIGN PATENT DOCUMENTS

DE 4204512 A1 * 8/1993 .......... H01J/37/153

* cited by examiner

*Primary Examiner*—Nikita Wells
*Assistant Examiner*—Erin-Michael Gill
(74) *Attorney, Agent, or Firm*—Edwin D. Schindler

(57) ABSTRACT

An optical particle corrector with a straight optical axis for eliminating color and aperture aberrations in optical particle lenses includes multipole elements in the form of electric and/or magnetic quadrupole and octupole elements. There are at least twelve quadrupole elements and ten octupole elements, in which three quadrupole elements and two octupole elements are assembled into a group. These groups are arranged successively along the straight optical axis, in which a first symmetrical plane is defined between the first and second groups, a second symmetrical plane is defined between the second and third groups and a third symmetrical plane is defined between the third and fourth groups. The multipole elements from one group to another correspond to each other in pairs, in which the multipole elements of the corresponding following group are positioned in reverse order along the straight optical axis in comparison with the corresponding multipole elements of the preceding group. The structure and refractive powers of the multipole elements that correspond to each other are mirror-symmetrically configured relative to the corresponding symmetrical plane between the groups. At least two of the quadrupole elements generate electric-magnetic quadrupole fields, in which the quadrupole element are, preferably, arranged in a mirror-symmetrical manner relative to the second, or to all, symmetrical planes. An additional octupole element is arranged in the first and third symmetrical planes. The corrector enables the transmission of extremely large image fields, while the optical quality remains the same due to the fact image aberrations outside the axis can be corrected.

20 Claims, 2 Drawing Sheets

OPTICAL PARTICLE CORRECTOR

BACKGROUND OF THE INVENTION

1. Field of the Invention

Figure 1:
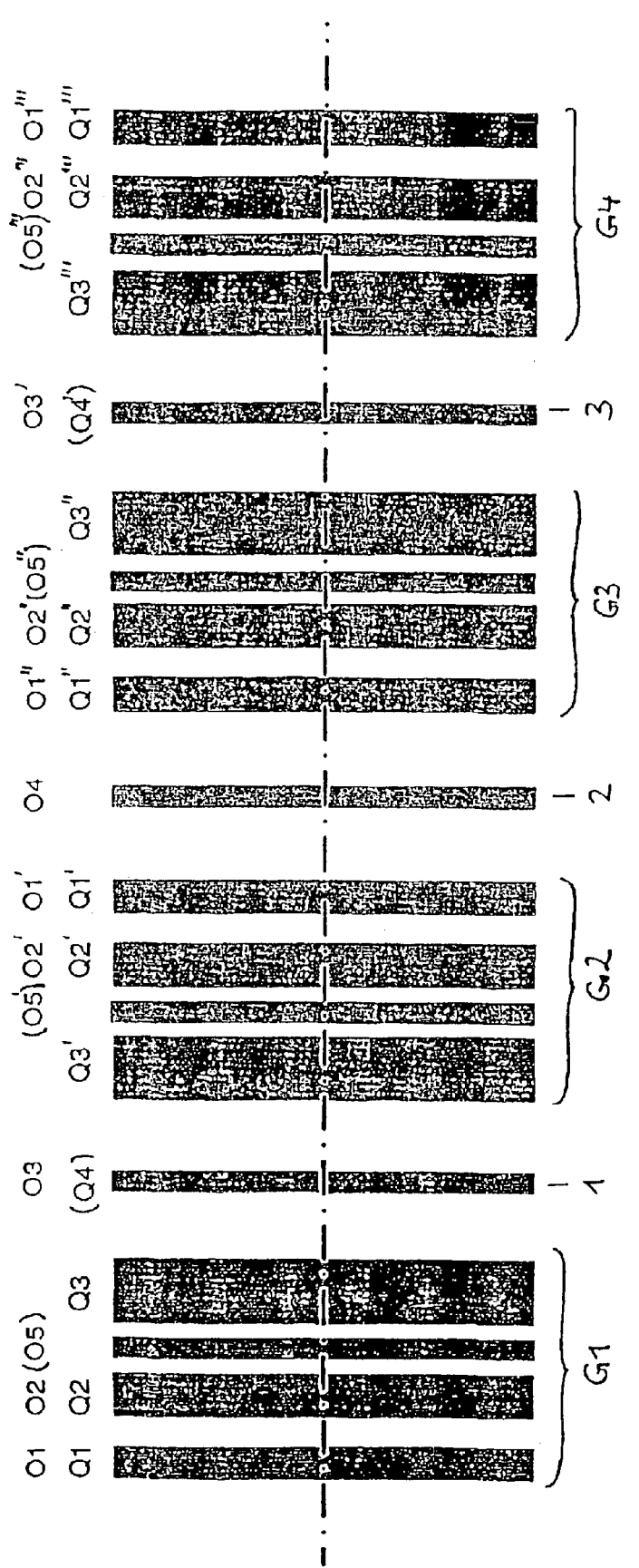

The invention relates to a corrector, which is equipped with multipole elements in the form of electrical and/or magnetic quadrupole and octupole elements, comprising a straight optical axis for eliminating the chromatic aberration and the divergence aberration of particle-optical lenses.

2. Description of the Prior Art

Particle-optical systems are successfully used both in enlarging systems, such as the electron microscopes, and in diminishing systems, such as electron-projection lithography. Compared with light-optical systems, they have the advantage of a substantially higher resolution, this magnitude being all the more marked the smaller the wavelength of the beams used. Where electron beams are used, this means a gain in resolution of a factor of $10^4$ compared to light.

A further improvement of the resolution of particle-optical systems requires a correction of the imagining lenses' own image aberrations. According to conventional nomenclature, these image aberrations are classified into:

Axial aberrations, which occur with the imaging of an axial point and are only dependent on the divergence angle. They are determined by the profile of the axial fundamental paths, $(x_\alpha)$, $(y_\beta)$, which emerge from an axial point on the object plane and lie in the x and y cross-sections.

Extra-axial aberrations, which are effective when an extra-axial image point is represented, and depend on the distance to the optical axis (and usually on the divergence angle) They are determined by the profile of the extra-axial fundamental paths $(x_\gamma)$, $(y_\delta)$, which emerge from an axially remote point on the object plane and lie in the x and y cross-sections, Chromatic aberrations, which occur with particles of different velocities, are further subdivided into axial and extra-axial chromatic aberrations and correspondingly depend on the divergence angle and/or on the distance from the optical axis.)

For axial aberrations, which only depend on the divergence angle, the term divergence aberrations is also commonly used, and for the axial and extra-axial image aberrations together, to distinguish from chromatic aberrations, the term geometrical image aberrations is also used.

Considerable efforts have been made in the past to correct these image aberrations, in particular chromatic aberration ($=1^{st}$ order axial aberrations) and divergence aberration ($=3^{rd}$ order divergence aberrations). The best successes to date have been achieved with optical systems in which, instead of rotationally symmetrical fields, the fields of multipoles, in particular quadrupoles and octupoles, are used. Systems of this kind are generally given the name corrective or corrector.

In the prior art, correctives or correctors of different designs are known.

German Patent 42 04 512 A1 discloses an electron-optical corrective which is constructed of 6 quadrupole elements and 7 octupole elements, three quadrupoles and three octupoles being provided in each case before and after the centre plane of the system, and a further octupole being arranged in the centre plane. The system permits simultaneous correction of the axial and extra-axial chromatic aberration and of the spherical aberration. Its advantage lies in a simple construction, a relatively small number of multipole elements and a comparatively small overall length. A disadvantage of this system, however, is that in applications in the maximum resolution range, the electrical supply is subject to extremely high stability requirements, which could not be satisfied hitherto. Furthermore, the magnitude of the image field of an objective lens corrective in the present corrective is limited in a disadvantageous manner, since the $3^{rd}$ order extra-axial image aberration of the lens with this system cannot be corrected.

A corrector for elimination of the chromatic aberration with purely electrical fields is presented in German Patent DE 199 26 927.0. The corrector proposed here has two corrective parts, which are arranged one behind the other along the optical axis and have in each case electrical quadrupole fields and superimposed octupole fields. The corrector permits a correction of the $1^{st}$ order axial chromatic aberration and the $3^{rd}$ order divergence aberration. The advantage of this corrector over that mentioned above is that the fields required for correction are electrostatic in nature and can therefore be adjusted precisely and, in particular, reproducibly. Because of the lack of correction of extra-axial aberrations, a high resolution can disadvantageously only be achieved in regions extremely close to the axis, so that the useful image-field size is greatly restricted.

Furthermore, a corrector is also known from German Patent 100 01 277.9, in which, in contrast to the method used here, the correction of image aberrations is carried out by means of a set of hexapoles, which are arranged alternately with circular lenses along the optical axis. In contrast to the correctors described above, that proposed here shows stigmatic intermediate images. This embodiment permits a correction of all $3^{rd}$ order geometrical aberrations and makes comparatively low demands of the stability of the electrical supply. A considerable disadvantage of this solution, however, lines in the fact that the provided corrector does not permit correction of the image aberration. Furthermore, the circular lenses acting as transfer lenses generate additional axial chromatic aberrations. The stigmatic intermediate images lead, because of the Boersch effect occurring in this area, to an additional energy spread of the electrons. The corrector also disadvantageously has a comparatively large overall length and can therefore only be used with restrictions.

SUMMARY OF THE INVENTION

Against this background it is the object of the present invention to provide a corrector which is characterised by comparatively low stability requirements on the electrical supply and permits correction of the $1^{st}$-order axial and extra-axial aberrations, all $3^{rd}$ order geometrical aberrations and the $5^{th}$ order divergence aberrations of a particle-optical circular lens. Furthermore, the corrector itself does not generate any $4^{th}$-order geometrical aberrations during correction.

This object is achieved according to the invention in that
at least twelve quadrupole elements and ten octupole elements are provided,
of which in each case three quadrupole elements and two octupole elements are collected to form a group,
the groups are arranged one behind the other along the optical axis,
the multipole elements from group to group correspond to one another in pairs,
the multipole elements of the respective following group are positioned in each case in reverse sequence along the optical axis to the corresponding multipole elements of the respective preceding group, and the construction and the fields of the respective mutually corresponding multipole elements are in each case mirror symmetrical to the respective centre plane between the groups, the centre plane between the first and second groups defines a first, the centre plane between the second and third groups defines a second, and the centre plane between the third and fourth groups defines a third plane of symmetry, at least two quadrupole elements generate electrical and magnetic quadrupole fields, these quadrupole elements preferably being arranged mirror symmetrically to the second or to all planes of symmetry, and, in each case, a further octupole element being provided in the first and third planes of symmetry.

DETAILED DESCRIPTION OF THE PREFERRED EMBODIMENTS

The corrector according to the present invention comprises four groups of three, which are arranged one behind the other along the optical axis and in each comprise three quadrupoles and two octupoles, The octupoles thereof are arranged such that their fields are superimposed on the quadrupole fields. The number of the respectively different elements is limited by the fact that the multipole elements from group to group in each case correspond to one another in pairs. The multiplicity of the elements is thereby reduced from 4 times 5 elements to 1 times 5 elements The multipole elements of the respective following group are therein positioned in each case in reverse sequence along the optical axis to the corresponding multipole elements of the respective preceding group.

The proposed embodiment describes a system with high symmetry, which is manifested in a double-symmetrical construction. Correspondingly, the first system half is symmetrical about the centre plane of the first system half, the second system half is symmetrical about the centre plane of the second system half, and the entire system is symmetrical about the centre plane of the entire system. The aforementioned centre planes are at the same time centre planes between the respective adjacent groups and define, in the direction of the beam path, a first, second and third plane of symmetry. The refractive powers of the quadrupoles in the first half of the system are preferably set so as to be antisymmetrical to the refractive powers in the second half of the system. Alternatively, the symmetrical choice of refractive powers is provided for.

The antisymmetrical choice has the decisive advantage that the corrector does not introduce aberrations with twofold symmetry.

Of the aforementioned quadrupoles, at least two, preferably however more than two, quadrupoles are designed such that they generate electrical and magnetic quadrupole fields. These electrical-magnetic quadrupoles are preferably arranged mirror symmetrically to the second or to all planes of symmetry, The system is completed with a further octupole element in each case, which is provided in the first and third planes of symmetry.

According to a further development of the inventions, the optical properties of the entire system, comprising upstream-connected particle-optical lenses and corrector, in the transmission of very large image aberrations, with a large number of image points are improved in that, while maintaining the double symmetry for the corrector, a further purely magnetic or electrical-magnetic quadrupole in each case is positioned in the first and third planes of symmetry. The number of quadrupole elements in the corrector increases in this further development to 14.

Important considerations for correction of image aberrations with non-circular multipole elements lead to the idea of providing the corrector with a high degree of symmetry. The double symmetry provided by the corrector according to the invention therefore has far-reaching effects on the electrical supply of the individual multipole elements and the size and nature of the image aberrations within the corrector.

Because of the given symmetry, the same currents or voltages in each case are applied to multipole elements corresponding to one another in the individual groups. By this means, on one hand, the number of units necessary for electrical supply is considerably reduced and, as a consequence thereof, in an advantageous manner, the design and material outlay for electrical supply of the individual elements is considerably reduced. On the other hand, the symmetrical design of the corrector also leads to fluctuations in the currents and voltage having only a slight or no influence on the stability of the entire system, since the disturbances acting on symmetrically designed elements either entirely or partially cancel each other. With the proposed system, therefore, lower requirements are made on the current and voltage supply. In standard applications of the proposed system, this leads to comparatively simple and therefore economical supply units. for applications in the extremely high resolution range, it is thereby ensured that the required stability requirements can be achieved by means of components available in the prior art.

The above-described symmetry also leads to a considerable simplification in adjusting the fields required for correction. By the setting of equal potentals or currents at the various multipole elements of the corrector, the per se wide variety of adjustment possibilities of a corrector is considerably reduced, this considerably simplifies the execution of the correction.

By means of the construction of the corrector from four groups of three, which are in each case equipped with electrical-magnetic quadrupoles, correction of the chromatic aberration can be distributed between a plurality of similar correction pieces. The correction contributions from the individual groups then add to for the entire correction, each contribution being comparatively weak on its own. Correspondingly, the excitation of the electrical-magnetic quadrupoles required for correction is lower than for correctors according to the prior art. The advantageous consequence of this is also a reduction of the stability demands on the electrical supplies.

The double-symmetrical construction of the corrector according to the present invention leads to a symmetrical/antisymmetrical progress of the paths and of their associated fields. This has far-reaching consequences for the influence of individual geometrical-optical aberrations, since particular contributions cannot occur solely for reasons of symmetry. The advantageous consequence of this is that the resolution of the particle-optical system is also essentially improved outside the range close to the axis.

As a result, the proposed corrector, with comparatively low stability requirements on the electrical supply, provides an appropriate means for simultaneous correction of the ($1^{st}$ order) axial chromatic aberration and all $3^{rd}$ order geometrical aberrations, for correction of the extra-axial chromatic aberration as well as the 5th order divergence aberrations of a particle-optical circular lens. Herein, the correction itself does not generate any $4^{th}$ order geometrical aberrations. The correction of the aberrations is implemented by means of suitable settings of the multipole elements and their arrangement on the optical axis, which is indicated in subclaims.

In a preferred embodiment of the corrector according to the invention, multipole elements are arranged such that the first group.

has at the entry side a quadrupole element for generating electrical and magnetic quadrupole fields (electrical-magnetic quadrupole) and, in its immediate vicinity, an octupole element.

followed by a second quadrupole element for generating electrical and magnetic quadrupole fields and, in its immediate vicinity, an octupole element.

and a quadrupole element for generating purely magnetic quadrupole fields (=magnetic quadrupole) is arranged at the output side.

Because of the given double symmetry, the construction is repeated in each group in reverse sequence in each case to the respective preceding group. The rays emerging from an object point, after passing through the objective, in the present embodiment, thus pass through the following fields in sequence:

| |  |
|---|---|
| Electrical and/or magnetic quadrupole 1 + octupole 1 | |
| Electrical-magnetic quadrupole 2 + octupole 2 | $1^{st}$ group |
| Electrical-magnetic quadrupole | |
| Octupole 3 - - - $1^{st}$ plane of symmetry | |
| Electrical-magnetic quadrupole | |
| Electrical-magnetic quadrupole 2 + octupole 2 | $2^{nd}$ group |
| Magnetic quadrupole 1 + octupole 1 | |
| Octupole 4 - - - $2^{nd}$ plane of symmetry | |
| Magnetic quadrupole 1 + octupole 1 | |
| Electrical-magnetic quadrupole 2 + octupole 2 | $3^{rd}$ group |
| Electrical-magnetic quadrupole | |
| Octupole 3 - - - $3^{rd}$ plane of symmetry | |
| Electrical-magnetic quadrupole | |
| Electrical-magnetic quadrupole 2 + octupole 2 | $4^{th}$ group |
| Magnetic quadrupole 1 + octupole 1 | |

The quadrupole fields determine the Gaussian (paraxial) beam path. According to a feature of the invention, the refractive powers of the magnetic quadrupoles and the entire refractive forces of the electrical-magnetic quadrupoles can in each case be adjusted such that the first axial fundamental path ($x_\alpha$) runs point symmetrically (antisymmetrically) to the first plane of symmetry, the second axial fundamental path ($y_\beta$) runs mirror-symmetrically to the first plane of symmetry, the first extra-axial fundamental path ($x_\gamma$) runs mirror-symmetrically to the first plane of symmetry, the second extra-axial fundamental path ($y_\delta$) runs point-symmetrically to the first plane of symmetry, With an antisymmetrical choice of the diffractive powers in the first and second half of the system, the paths of the xz-cross-section and the associated paths of the yz cross-section exchange their roles in the central plane of symmetry.

With asymmetrical choice of the diffractive powers in the first and second half of the system, the axial paths run symmetrical to the central plane of symmetry and the extra-axial path runs antisymmetrical.

The ray path of the axial and extra-axial ray bundles through the corrector then appears as follows:

The rays emerging from an object point on the optical axis, when they enter into the corrector, undergo an astigmatic splitting by means of the quadrupole, as a result of which the paths running in the x and y cross-sections are deflected in different directions. The axial or extra-axial particle bundle is thereby focused in a cross-section, for example in the y cross-section, while in the other cross-section, the x cross-section, it is spread out, so that an astigmatic intermediate image is produced. With each of the following quadrupoles, the focusing and defocusing of the beams in both cross-sections are repeated by amounts that are defined in each case such that the entire ray path and all intermediate images within the corrective turn out to be astigmatic. The last quadrupole then ensures that, in the case of both axial and extra-axial particle bundles, the astigmatism is cancelled and rotational symmetry is restored. Both particle bundles therefore leave the corrector without splitting.

Each of the four groups of three quadrupole elements then contains, for one cross-section, two focusing and one defocusing element and, for the other cross-section, one focusing and two defocusing elements. The fields of the corrector quadrupoles thereby act essentially only on the spread-out rays, and consequently their path trajectory is subject to a considerable influence and a negative contribution to the chromatic aberration. The paths extending close to the optical axis, on the other hand, are little influenced by the fields of the quadrupoles; the contributions for changing the chromatic aberration therefore turn out to be small in these regions.

For correction of the axial and extra-axial chromatic aberration, the refractive powers of the quadrupole fields are preset with a suitable magnitude. They determine the Gaussian ray path, only the entire refractive powers in each case being decisive here. For the electrical-magnetic quadrupoles, therefore, the components of the refractive powers originating from the magnetic and electrical fields vary with respect to one another without the paraxial ray path being influenced. This property is utilised in a manner known per se for correction of the chromatic aberration. The splitting of the quadrupole refractive powers into an electrical and a magnetic component, while maintaining the same overall refractive power, is therefore used as a parameter set for elimination of the chromatic aberration. According to a feature of the invention, the intensities of the electrical and magnetic quadrupole fields can be preset such that the axial chromatic aberrations and/or the extra-axial chromatic aberrations of the corrector and objective compensate one another.

There is a certain freedom in the concrete selection of the quadrupoles that are to be formed in a combined electrical-magnetic manner. It is only essential that a sufficient number of degrees of freedom are available for compensatory setting of the axial and extra-axial chromatic aberration contributions, both in the x and y cross-section.

The correction of the $3^{rd}$ order divergence aberration and the $3^{rd}$ order extra-axial geometrical aberrations is carried out by means of the octupoles. To achieve a complete correction of these aberrations,—according to a chief consideration of the invention—a double-symmetrical construction of the corrector and a symmetrical positioning of the octupole are necessary. In the above-defined preferred embodiment of the correction, one octupole in each case is located in the first and third plane of symmetry. This symmetrical pair serves for correction of the $3^{rd}$ order divergence aberration The correction of the $3^{rd}$ order extra-axial aberrations, in particular the field astigmatism and image-field curvature, on the other hand, is carried out by means of the octupoles, which are superimposed on the electrical-magnetic quadrupoles of each group or positioned between them.

The further octupole arranged in the centre plane of the entire system is provided for correction of the $5^{th}$ order divergence aberration.

The setting of the aforementioned octupoles covers a large multiplicity of possibilies. According to the present invention, it is in particular provided to set the intensities of the octupole elements such that all 3rd order geometrical aberrations of corrector and particle-optical lens in each case compensate one another.

the 5th order divergence aberrations of corrector and particle-optical lens compensate one another.

the $3^{rd}$ order divergence aberration and/or the $5^{th}$ order divergence aberration of the entire system comprising the corrector particle-optical lens assume a presettable, defined value The last-mentioned setting is of interest in particular for the generation of phase-contrast images in high-resolution transmission electron microscopy. Here, optimum contrast and maximum object information is obtained if the 3rd and $5^{th}$ order axial aberrations of the entire system in each case assume defined values. In this application case, it is therefore necessary not to eliminate the aforementioned aberrations of the entire system, but to set them to particular values.

According to a feature of the invention, the octupole fields can also be superimposed on the quadrupole fields. In the present corrector, this is used in that the octupole fields employed for correction of the divergence aberration are superimposed on the fields of the quadrupoles arranged within the individual groups.

In a preferred embodiment of the corrector according to the invention, multipole elements are used, which generate both quadrupole fields and octupole fields. By this means, the clarity of the corrector is improved and the costs for its production are substantially reduced.

The proposed corrector can advantageously be used in different particle-optical systems.

The correction according to the present invention is preferably used in enlarging particle-optical systems . It is in particular used in high-resolution transmission electron microscopy (TEM), to compensate for the aberrations of the objective. For this case, it is provided to arrange the corrector—seen in the ray direction—behind the objective lens.

Whereas with the use of hexapole correctors according to the prior art, the chromatic aberration is uncorrectable, the corrector according to the present invention permits simultaneous correction of chromatic and divergence aberrations. Since the electrons of the electron sources used for exposing the object continually have a finite energy spread, by elimination of the $1^{st}$ order chromatic aberration, a substantial limitation is eliminated. For phase-contrast imaging, it is also important that the present corrector permits adjustment of the $3^{rd}$ and $5^{th}$ order divergence aberrations to defined values, since optimum contrast and maximum object information is available at non-zero values of the aforementioned aberrations.

With the development of larger CCD cameras, a large image-field size is also required in a high-resolution microscopy, in particular in applications in structural biology. The present invention meets these requirements by correction of the extra-axial $3^{rd}$ order image aberrations.

The high stability requirements on the electrical supplies that were hitherto problematic in high-resolution microscopy are also lessened by means of the corrector according to the present invention. Because of the high symmetry of the systems, fluctuations of currents and voltages are largely compensated and therefore do not have an effect on the entire system.

According to a feature of the invention, the use of the corrector according to the invention in electron microscopy with a large pole-shoe gap is also provided, preferably in the field of "in situ" electron microscopy. The large pole shoe gap is required for the aforementioned microscopes to obtain sufficient space for manipulation of the specimen in the object chamber. Such lenses have a very large chromatic aberration. To permit images with low illumination and low exposure times, large energy windows, that is to say electrons with a large energy spectrum, are necessary. These boundary conditions hitherto led to the disadvantageous consequence that only very low resolutions were achievable. Since the present invention permits the low-aberration transmission of large energy windows, by use of the corrector according to the invention, high resolutions can be obtained even with lenses with large pole-shoe spacings. The corrector of the $3^{rd}$ order geometrical image aberrations is also desired for the aforementioned application, since large aberrations are desirable here.

A further use of the corrector is provided according to the present invention in diminishing optical systems, in particular electron projection lithography. These systems are used for imaging defined structures applied to a mask on a crystal (wafer) located in the image plane, and imprint it by means of the impinging electrodes. For this application case, short focal length electron lenses are required, which image the greatest possible area of the mask on the wafer. Here, the conventional use of scatter contrast masks leads to a strong energy spreading of the imaging particle beam. In contrast to other correction systems, the present invention here offers the possibility, because of the chromatic aberration correction, of also imaging particle beams with a large energy spectrum in high optical quality. The necessary image-field size for use of the proposed corrector is ensured by the correction of the extra-axial $3^{rd}$ order geometrical image aberrations.

In this case, the further development of the invention described in the preferred embodiments is particularly advantageous, since the optical quality of the image further improves very large image aberrations, which can justify the extra design work.

BRIEF DESCRIPTION OF THE DRAWING FIGURES

Further details, features and advantages of the invention can be taken from the following part of the description. In this part, the construction and beam path corrector according to the invention are explained in greater detail with reference to an accompanying drawing, wherein FIG. 1 shows a longitudinal cross-section through a corrector in a greatly simplified representation.

Figure 2:
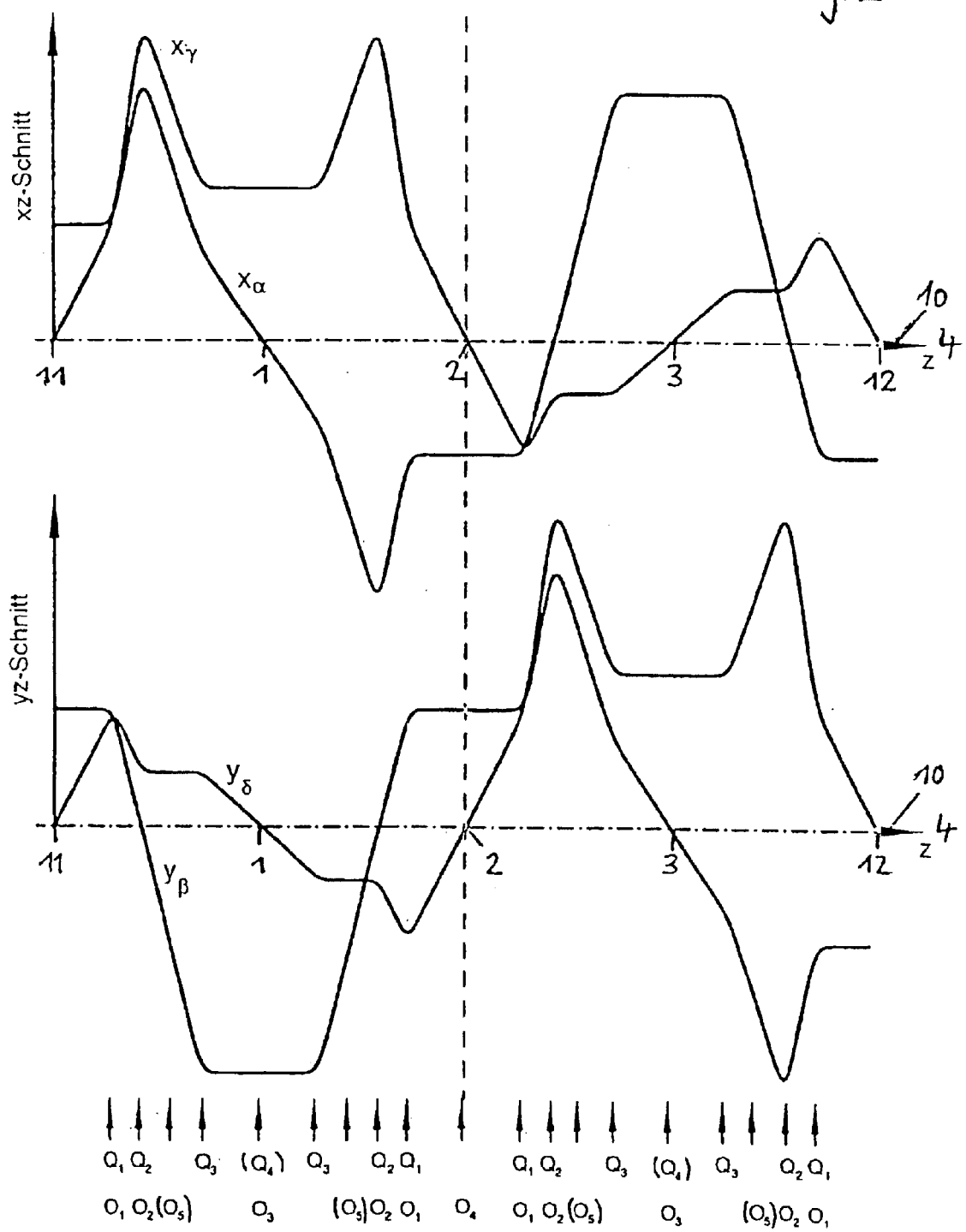

FIG. 2 shows the trajectory of the fundamental paths through the corrector for a preferred embodiment.

DETAILED DESCRIPTION OF THE DRAWING FIGURES

FIG. 1 shows the principal construction of the corrector for an exemplary embodiment in which the various multipole elements are represented by means of differently developed rectangles. Herein, the reference characters Q1, Q2, Q3, . . . Q1''', Q2''', Q3'''' and Q4, Q4' represent quadrupoles, O1, O2, . . . O1''', O2''' and O3, O3' and O4 and O5 . . . O5' represent octupoles.

Elements with the same numbers here have the same design in each case. The quadrupole elements and the octupole elements are in each case collected to form a group G1–G4. As can be seen from the figure, the multipole elements correspond to one another in pairs from group to group (Q1 and Q1', Q1' and Q1", etc.), the multipole elements of the respective following group (e.g. Q3', Q2', Q1') are positioned in each case in reverse sequence along the optical axis 4 to the corresponding multipole elements of the respective preceding group. (e.g. Q1, Q2, Q3).

Because of this arrangement, the present corrector has a high symmetry, the planes of symmetry lying in the respective centre planes between the individual groups G1–G4. Thus, between the first and second group G1/G2, a first 1, between the second and third group G2/G3, a second 2 and between the third and fourth group G3/G4, a third plane of symmetry 3 is defined. Here, the position of the individual multipole elements mirror-symmetrically to the aforementioned planes of symmetry is predetermined.

In the present embodiment, the quadrupoles Q2, Q3 and the similarly designed quadrupoles Q2', Q3'; Q2", Q3"; Q2''', Q3''' are determined as electrical-magnetic elements. The electrical and magnetic quadrupole fields generated by them are used for correction of the $1^{st}$ order chromatic aberration.

Optionally, two electrical-magnetic quadruples (Q4, Q4") are provided, the refractive powers of which are completely compensated in paraxial approximation.

The octupole elements O1–O5 serve for correction of the $3^{rd}$ order divergence aberration of the extra-axial $3^{rd}$ order geometrical aberration and of the $5^{th}$ order divergence aberration. The correction of the $3^{rd}$ order extra-axial aberrations, in particular the field astigmatism and image-field curvature is carried out by means of the octupoles O1–O5'''. The pair O3, O3' which is arranged symmetrically to the centre plane 2 of the entire system carries out the correction of the $3^{rd}$ order divergence aberration, and the octupole O4 arranged in the centre plane 2 carries out the correction of the $5^{th}$ order divergence aberration.

FIG. 2 shows the telescopic beam path within the corrector in paraxial approximation by means of the trajectory of the axial fundamental paths $(x_\alpha)$, $(y_\beta)$ and the extra-axial fundamental paths $(x_\gamma)$, $(y_\delta)$ The beam direction is from left to right; it is indicated by the arrow 10 on the optical axis 4 of the system. The left delimitation of the figure identifies the focal plane 11 behind the objective lens; the right one identifies the conjugated focal plane 12 behind the corrector. The reference characters 1, 2, 3 indicate the first, second and third planes of symmetry of the corrector.

As can be seen from the figure, the corrector images the entry plane 11 stigmatically and without distortion in the exit plane 12. If the trajectory of the axial fundamental paths $(x_\alpha)$, $(y_\beta)$ and the extra-axial fundamental paths $(x_\gamma)$, $(y_\delta)$ is followed, the high degree of symmetry of the correction becomes apparent.

With the entry of these beams into the corrector, the quadrupole Q1, whose position on the horizontal axis is indicated, has the effect that the paths extending in the x and y cross-section respectively are deflected in different directions. The axial or extra-axial particle bundle is thereby focused in the y cross-section, that is to say deflected towards the optical axis, while in the x cross-section, it is spread out, that is to say deflected say away from the optical axis. The astigmatic splitting of the particle bundles is retained during passage through the entire corrector. It is changed by the downstream quadrupoles Q2, Q3 etc. by defined amounts in each case and only cancelled again by quadrupole Q1''' when it leaves the corrector.

Each group of three quadrupole elements then contains, for one cross-section, two focusing and one defocusing element and, for the other cross-section, one focusing and two defocusing elements. As can be seen from the figure, astigmatic intermediate images are thereby produced, which, in the case of the axial fundamental paths $(x_\alpha)$, $(y_\beta)$ lie, for example, in the centre of the quadrupoles Q2, Q2', Q2", Q2''' and at the location of the octopoles O3, O3' lie in the planes of symmetry 1 and 3 respectively. The interaction of the quadrupole elements effects overall the intended optical behaviour of the corrector during correction of the chromatic aberration. The optionally provided quadrupoles Q4, Q4' permit lower electrical field intensities with the same or even improved correction effect.

What is claimed is:

1. A particle optical corrector having multipole elements in the form of electrical quadrupole or magnetic quadrupole elements and octupole elements for eliminating chromatic aberration and spherical aberration of particle optical lenses, said particle optical corrector comprising:

at least twelve quadrupole elements (Q1–Q3''') and ten octupole elements (O1–O4) with three quadrupole elements of said twelve quadrupole elements and two octupole elements of said ten octupole elements forming a group of elements (G) with a plurality of groups of elements (G1–G4) being arranged one group behind another group along a straight optical axis;

said multipole elements from said group of elements to said group of elements corresponding to one another in pairs (Q1 and Q1'; Q2 and Q2'; Q3 and Q3') and said multipole elements (Q3', Q2', Q1') of a respective following said group of elements being positioned in reverse sequence along said straight optical axis to corresponding said multipole elements (Q1, Q2, Q3) or a respective preceding said group of elements;

the respective mutually corresponding multipole elements (Q1, Q1', Q1", Q1'''; O1, O1', O1", O1''') are mirror symmetrical to respective center planes between each said group of elements, with said center plane between a first group of elements and a second group of elements defining a first plane of symmetry, said center plane between said second group of elements and a third group of elements defining a second plane of symmetry, said center plane between said third group of elements and a fourth group of elements defining a third plane of symmetry;

at least two quadrupole elements of said at least twelve quadrupole elements generating an electrical quadrupole field and a magnetic quadrupole field and said at least two quadrupole elements being arranged mirror symmetrically to at least said second plane of symmetry; and, an additional octupole element being provided in said first plane of symmetry and said third plane of symmetry.

2. The particle optical corrector according to claim 1, wherein said at least two quadrupole elements are arranged mirror symmetrically to said first plane of symmetry, said second plane of symmetry and said third plane of symmetry.

3. The particle optical corrector according to claim 1, wherein said quadrupole elements have field intensities selected so that said quadrupole elements have refractive powers that are symmetrical to said first plane of symmetry and antisymmetrical to said second plane of symmetry.

4. The particle optical corrector according to claim 1, wherein said quadrupole elements have field intensities selected so that said quadrupole elements have refractive powers that are symmetrical to said first plane of symmetry and said second plane of symmetry.

5. The particle optical corrector according to claim 1, wherein said plurality of groups of elements include a first group of elements, a second group of elements and a third group of elements, wherein said quadrupole elements include a first quadrupole element, a second quadrupole element and a third quadrupole element, and wherein said octupole elements include a first octupole element, a second octupole element and a third octupole element, said first group of elements has, at an entry side, said first quadrupole element for generating an electrical quadrupole field or a magnetic quadrupole field and, in its immediate vicinity, said first octupole element;

said second quadrupole element for generating an electrical quadrupole field or a magnetic quadrupole field and, in its immediate vicinity, said second octupole element; and, said third quadrupole element for generating a magnetic quadrupole field or an electrical quadrupole field and arranged at an output side.

6. The particle optical corrector according to claim 1, further comprising means for adjusting intensities of the electrical quadrupole fields and magnetic quadrupole fields of said quadrupole elements so that axial chromatic aberrations or extra-axial chromatic aberrations are able to, at least partially, compensate one another.

7. The particle optical corrector according to claim 1, wherein for each said group of elements, an additional octupole element is arranged between a second quadrupole element and a third quadrupole element of said quadrupole elements.

8. The particle optical corrector according to claim 1, further comprising means for adjusting intensities of said octupole fields so that axial and extra-axial third order aberrations are able to, at least partially, compensate one another.

9. The particle optical corrector according to claim 1, further comprising an additional octupole element in said second plane of symmetry with means for adjusting intensities of said quadrupole elements and said additional quadrupole element so that a fifth order divergence aberration compensate one another.

10. The particle optical corrector according to claim 1, further comprising means for adjusting intensities of said octupole elements so that a third order divergence aberration or a fifth order divergence aberration of said particle optical corrector assume a settable value.

11. The particle optical corrector according to claim 1, wherein at least one of said octupole elements is superimposed on one of said quadrupole elements.

12. The particle optical corrector according to claim 1, wherein one of said multipole elements generates both a quadrupole field and an octupole field.

13. The particle optical corrector according to claim 1, further comprising means for forming an image of a coma-free plane on a particle optical lens.

14. The particle optical corrector according to claim 1, further comprising an objective lens with adaption of said objective lens being carried out by either enlarging transfer optics or diminishing transfer optics.

15. The particle optical corrector according to claim 1, further comprising a first additional magnetic quadrupole element in said first plane of symmetry and a second additional magnetic quadrupole element in said third plane of symmetry.

16. The particle optical corrector according to claim 1, further comprising a first additional combined electric-magnetic quadrupole element in said first plane of symmetry and a second additional combined electric-magnetic quadrupole element in said third plane of symmetry.

17. The particle optical corrector according to claim 16, further comprising means for adjusting said first additional combined electric-magnetic quadrupole element and said second additional combined electric-magnetic quadrupole element so that their total refractive powers are compensated in paraxial approximation.

18. The particle optical corrector according to claim 1, further comprising an additional magnetic quadrupole element in said first plane of symmetry and an additional combined electric-magnetic quadrupole element in said third plane of symmetry.

19. The particle optical corrector according to claim 1, further comprising an additional combined electric-magnetic quadrupole element in said first plane of symmetry and an additional magnetic quadrupole element in said third plane of symmetry.

20. The particle optical corrector according to claim 1, wherein said quadrupole elements immediately following one another with the same level of excitation are designed as a single element.

* * * * *